United States Patent
Saito et al.

(10) Patent No.: US 7,923,377 B2
(45) Date of Patent: Apr. 12, 2011

(54) METHOD FOR FORMING AMORPHOUS CARBON FILM

(75) Inventors: Takao Saito, Nagoya (JP); Tatsuya Terazawa, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 12/396,621

(22) Filed: Mar. 3, 2009

(65) Prior Publication Data

US 2009/0246407 A1    Oct. 1, 2009

(30) Foreign Application Priority Data

Mar. 27, 2008    (JP) ................................. 2008-083520

(51) Int. Cl.
*H01L 21/31*    (2006.01)

(52) U.S. Cl. ............. 438/758; 427/249.1; 257/E21.005; 257/E21.041; 257/E21.27

(58) Field of Classification Search .................. 438/758; 427/249.1; 257/E21.005, E21.041, E21.049, 257/E21.128, E21.27, E21.277

See application file for complete search history.

(56) References Cited

U.S. PATENT DOCUMENTS

| 5,073,785 A * | 12/1991 | Jansen et al. ..................... 347/45 |
| 2003/0230938 A1 * | 12/2003 | Hatano et al. ................. 307/106 |
| 2004/0161534 A1 * | 8/2004 | Saito et al. ................. 427/249.1 |

FOREIGN PATENT DOCUMENTS

JP    2004-270022 A1    9/2004

* cited by examiner

*Primary Examiner* — Walter L Lindsay, Jr.
*Assistant Examiner* — Leonard Chang
(74) *Attorney, Agent, or Firm* — Burr & Brown

(57) ABSTRACT

An amorphous carbon film forming apparatus includes a supporting electrode that is connected to ground and supports a substrate, a counter electrode that is disposed so as to face the supporting electrode and has a mixed-gas injection orifice, a chamber containing the supporting electrode and the counter electrode, and a DC pulse generator having a pulse source that applies a DC pulse voltage between the supporting electrode and the counter electrode. An amorphous carbon film is formed by supplying a mixed gas between the supporting electrode and the counter electrode such that the percentage of the acetylene gas relative to the carrier gas is 0.05% by volume or more and 10% by volume or less, and by generating plasma while a DC pulse voltage having a pulse width of 0.1 µsec or more and 5.0 µsec or less is applied to the counter electrode.

4 Claims, 3 Drawing Sheets

METHOD FOR FORMING AMORPHOUS CARBON FILM

BACKGROUND OF THE INVENTION

1. Field of the Invention

The present invention relates to a method for forming an amorphous carbon film.

2. Description of the Related Art

A method for forming a carbon film on a metallic base material is well known. In a method for forming a film described in Japanese Unexamined Patent Application Publication No. 2004-270022, for example, a metallic base material is disposed on one of two electrodes in a chamber, and a carbon film having a hardness of 10 GPa or more is formed at an ambient pressure of 100 to 1600 Torr by applying a pulse voltage between the two electrodes and by supplying helium gas as a dilution gas and methane gas as a raw material gas such that the percentage of the methane gas relative to the helium gas is at a desired value.

Not only a carbon film having a hardness of 10 GPa or more but also a carbon film having a relatively low hardness of less than 10 GPa will have various applications. For example, such a carbon film is applicable to a coating used for sliding metal parts. In other words, since a carbon film having a relatively low hardness of less than 10 GPa is softer than a carbon film having a hardness of 10 GPa or more and accumulates less internal stress when a film is formed, such a carbon film can be formed on a material with a low elastic modulus such as aluminum and a thicker film can be achieved. If, for example, a one-atom layer of a coating is shaved off every time the coating is rubbed, such a thicker film has longer life. However, few methods for forming a carbon film having a relatively low hardness of less than 10 GPa has been proposed. In particular, a method for forming a carbon film at a pressure of more than 10 Torr and smaller than or equal to atmospheric pressure has not been proposed.

SUMMARY OF THE INVENTION

Accordingly, it is a main object of the present invention to provide a method for forming an amorphous carbon film having a relatively low hardness at a pressure of more than 10 Torr and smaller than or equal to atmospheric pressure.

In the present invention, the following measure is adopted to achieve the object described above.

The present invention provides a method for forming an amorphous carbon film on a base material at a pressure of 10 Torr or more and smaller than or equal to atmospheric pressure using an amorphous carbon film forming apparatus that includes a supporting electrode connected to ground and a counter electrode disposed so as to oppose the supporting electrode, the method including the steps of (a) placing the base material on the supporting electrode, the base material being placed apart from the counter electrode; and (b) forming the amorphous carbon film by supplying a mixed gas of acetylene gas and a carrier gas carrying the acetylene gas between the supporting electrode and the counter electrode such that the percentage of the acetylene gas relative to the carrier gas is 0.05% by volume or more and 10% by volume or less, and by generating plasma while a DC pulse voltage having a pulse width of 0.1 µsec or more and 5.0 µsec or less is applied to the counter electrode.

In the method for forming an amorphous carbon film, the condition under which the pressure is less than 10 Torr is not preferable because the film forming rate is low under that vacuum. The condition under which the pressure is more than atmospheric pressure is also not preferable because a film cannot be formed due to arc discharge. Furthermore, the condition under which the pulse width of the DC pulse voltage is less than 0.1 µsec is not preferable because discharge does not occur or the hardness of the formed film is too low. The condition under which the pulse width is more than 5.0 µsec is also not preferable because a film cannot be formed due to arc discharge. The condition under which the percentage of the acetylene gas relative to the carrier gas is less than 0.05% by volume is not preferable because the film forming rate is low under that vacuum or the hardness of the formed film is too low. The condition under which the percentage of the acetylene gas is more than 10% by volume is not preferable because a film cannot be formed or the hardness of the formed film reaches 10 GPa or more. Accordingly, the pressure, the pulse width of the DC pulse voltage, and the percentage of the acetylene gas relative to the carrier gas are respectively set to 10 Torr or more and smaller than or equal to atmospheric pressure, 0.1 µsec or more and 5.0 µsec or less, and 0.05% by volume or more and 10% by volume or less. A carbon film with a relatively low hardness can be formed at a pressure of more than 10 Torr and smaller than or equal to atmospheric pressure. Although the reason is unclear, it is assumed that, by using acetylene gas, carbon-carbon triple bonds are actively incorporated into a film to make the composition of the film close to that of graphite, so that the hardness of the film can be prevented from being increased. The hardness of the formed film is measured using a mechanical property evaluation apparatus for thin films (Nano Indenter XP available from MTS Systems Corporation).

In the method for forming an amorphous carbon film according to the present invention, an amorphous carbon film having a hardness of 2 GPa or more and 8 GPa or less may be formed in the step (b). Since an amorphous carbon film having a hardness of 2 GPa or more and 8 GPa or less will have many applications due to its softness described above, the application of the present invention is quite significant.

In the method for forming an amorphous carbon film according to the present invention, the DC pulse voltage may be a positive voltage.

In the method for forming an amorphous carbon film according to the present invention, the base material is preferably made of an SUS material, an SKD material, an SKH material, an SS material, aluminum, or an aluminum alloy. Examples of the SUS material include iron-chromium-nickel SUS304 and SUS316, iron-chromium SUS410 and SUS430, and SUS440. Examples of the SKD material include SKD11 and SKD61. Examples of the SKH material include SKH2, SKH10, SKH51, and SKH55. Examples of the SS material include SS330, SS400, SS490, and SS540. Examples of the aluminum alloy include A2011, A2017, A5052, A5056, A6061, A6063, and A7075.

In the method for forming an amorphous carbon film according to the present invention, in the step (b), a device having an inductor, a first semiconductor switch, and a second semiconductor switch that are connected in series between both terminals of a DC power supply unit may be used as a generator of the DC pulse voltage, the inductor having a terminal connected to an anode terminal of the first semiconductor switch and another terminal connected to a gate terminal of the first semiconductor switch through a diode, the diode having an anode terminal connected to the gate terminal of the first semiconductor switch; inductive energy is stored in the inductor with an electrical connection of the first semiconductor switch that occurs when the second semiconductor switch is turned on; and a pulse voltage is generated in the inductor with a turn-off of the first semiconductor switch that occurs when the second semiconductor switch is turned off, and the pulse voltage is raised and supplied to a coil element magnetically connected to the inductor. As a result, a DC pulse voltage that sharply rises can be applied to the counter electrode.

DETAILED DESCRIPTION OF THE INVENTION

Figure 1:
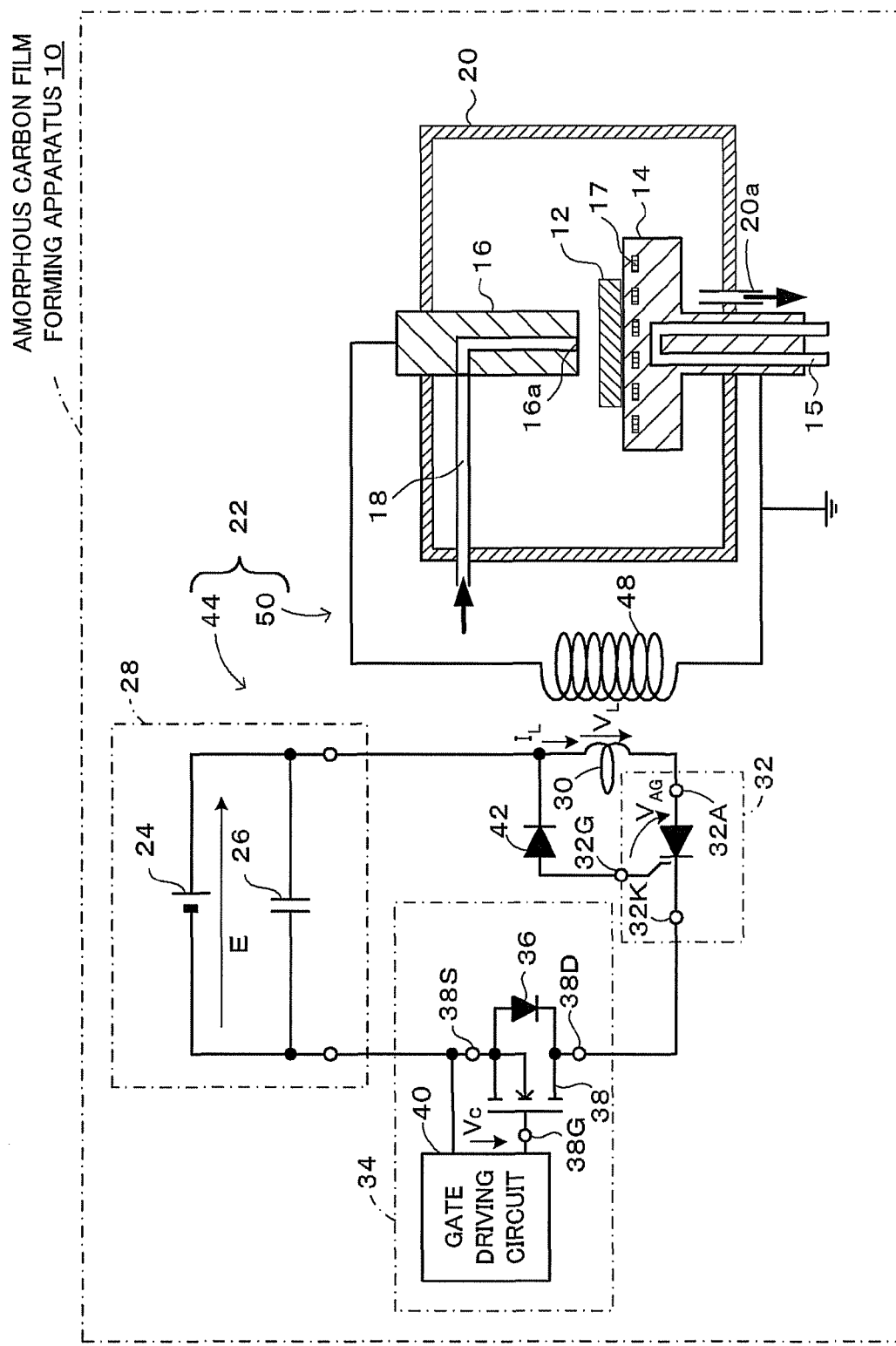
FIG. 1 is a schematic view showing an amorphous carbon film forming apparatus.

A preferred embodiment of the present invention will now be described with reference to drawings. FIG. 1 is a schematic view showing an amorphous carbon film forming apparatus 10.

With the amorphous carbon film forming apparatus 10, an amorphous carbon film can be formed, at a pressure of 10 Torr or more and smaller than or equal to atmospheric pressure, on a substrate 12 made of an iron material such as an SUS material, an SKD material, an SKH material, or an SS material or an aluminum material such as aluminum or an aluminum alloy. The amorphous carbon film forming apparatus 10 includes a supporting electrode 14 that is connected to ground and supports the substrate 12, a counter electrode 16 that is disposed so as to face the supporting electrode 14 and has a mixed-gas injection orifice 16a, a chamber 20 made of stainless steel that contains the supporting electrode 14 and the counter electrode 16, and a DC pulse generator 22 having a pulse source that applies a DC pulse voltage between the supporting electrode 14 and the counter electrode 16.

The supporting electrode 14 includes a circular plate made of SUS304 with a diameter of 100 mm and a thickness of 10 mm and a cylindrical shaft with a diameter of 50 mm that is disposed under the circular plate in an integrated manner. The supporting electrode 14 has a built-in heater 17, and a coolant path 15 where a coolant can flow is formed within the supporting electrode 14. A desired temperature of the supporting electrode 14 can be maintained by controlling the flow rate of the coolant that flows in the coolant path 15. Examples of the heater 17 include an infrared heater and a sheathed heater. Instead of the built-in heater 17, a heater 17 may be disposed near the supporting electrode 14.

The counter electrode 16 is a cylindrical member made of SUS304 with a diameter of 15 mm, an inside diameter of 5 mm, and a height of 50 mm. The counter electrode 16 and the supporting electrode 14 sandwich the substrate 12, and the counter electrode 16 is disposed at a position 5 mm apart from the surface of the substrate 12. The counter electrode 16 is insulated from the chamber 20.

A flow path of a mixed gas, which is constituted by acetylene gas that is a material of the amorphous carbon film to be formed on the substrate 12 and a carrier gas that carries the acetylene gas, is formed inside the counter electrode 16. One end of the flow path is connected to a mixed-gas supplying pipe 18 where the mixed gas supplied from the outside of the chamber 20 comes in. The other end of the flow path functions as the mixed-gas injection orifice 16a where the mixed gas is injected to the substrate 12.

It is not necessary to dispose a solid dielectric on the supporting electrode 14 and the counter electrode 16. Since ions are mainly used to form the amorphous carbon film, ionic conduction in plasma is prevented if a dielectric is disposed thereon. As a result, the amorphous carbon film with wear resistance is not formed.

The chamber 20 is formed so as to surround the supporting electrode 14 and the counter electrode 16 with a plate made of stainless steel. The chamber 20 is connected to a vacuum pump (not shown) such as an oil rotary pump and includes an air outlet 20a for controlling the pressure inside the chamber 20 to negative pressure by driving the vacuum pump.

The DC pulse generator 22 includes a primary winding circuit 44 and a secondary winding circuit 50. The primary winding circuit 44 includes an inductor 30, a first semiconductor switch 32, and a second semiconductor switch 34 that are connected in series between both terminals of a DC power supply unit 28. The DC power supply unit 28 includes a DC power supply 24 and a capacitor 26 that lowers a high-frequency impedance. The secondary winding circuit 50 includes a coil element 48 having one terminal electrically connected to the counter electrode 16 and another terminal electrically connected to the ground. In the primary winding circuit 44, the inductor 30 has a terminal connected to an anode terminal 32A of the first semiconductor switch 32 and another terminal connected to a gate terminal 32G, which is a control terminal, of the first semiconductor switch 32 through a diode 42. The diode 42 has an anode connected to the gate terminal 32G of the first semiconductor switch 32. A device controlled by current, a self-turn-off device, or a commutation-turn-off device can be used as the first semiconductor switch 32. In this case, a static induction (SI) thyristor is used because it has a significantly large tolerance relative to a voltage build-up rate (dv/dt) when being turned off and also has a high voltage rating. A self-turn-off device or a commutation-turn-off device can be used as the second semiconductor switch 34. In this case, a power metal oxide semiconductor field-effect transistor (power MOSFET) 38 including an avalanche diode 36 in inverse-parallel connection is used. The second semiconductor switch 34 includes the power MOSFET 38 and a gate driving circuit 40 that is connected to a gate terminal 38G and a source terminal 38S of the power MOSFET 38 and that controls ON/OFF of an electric current flow between the source terminal 38S and a drain terminal 38D. The inductor 30 of the primary winding circuit 44 is a primary winding and the coil element 48 of the secondary winding circuit 50 is a secondary winding, both of which function as a transformer. A voltage of VAG×N2/N1 can be applied to both terminals of the coil element 48 in the secondary winding circuit 50, where N1 is the number of turns of the primary winding, N2 is the number of turns of the secondary winding, and VAG is a voltage between the anode and gate of the first semiconductor switch 32.

Figure 2:
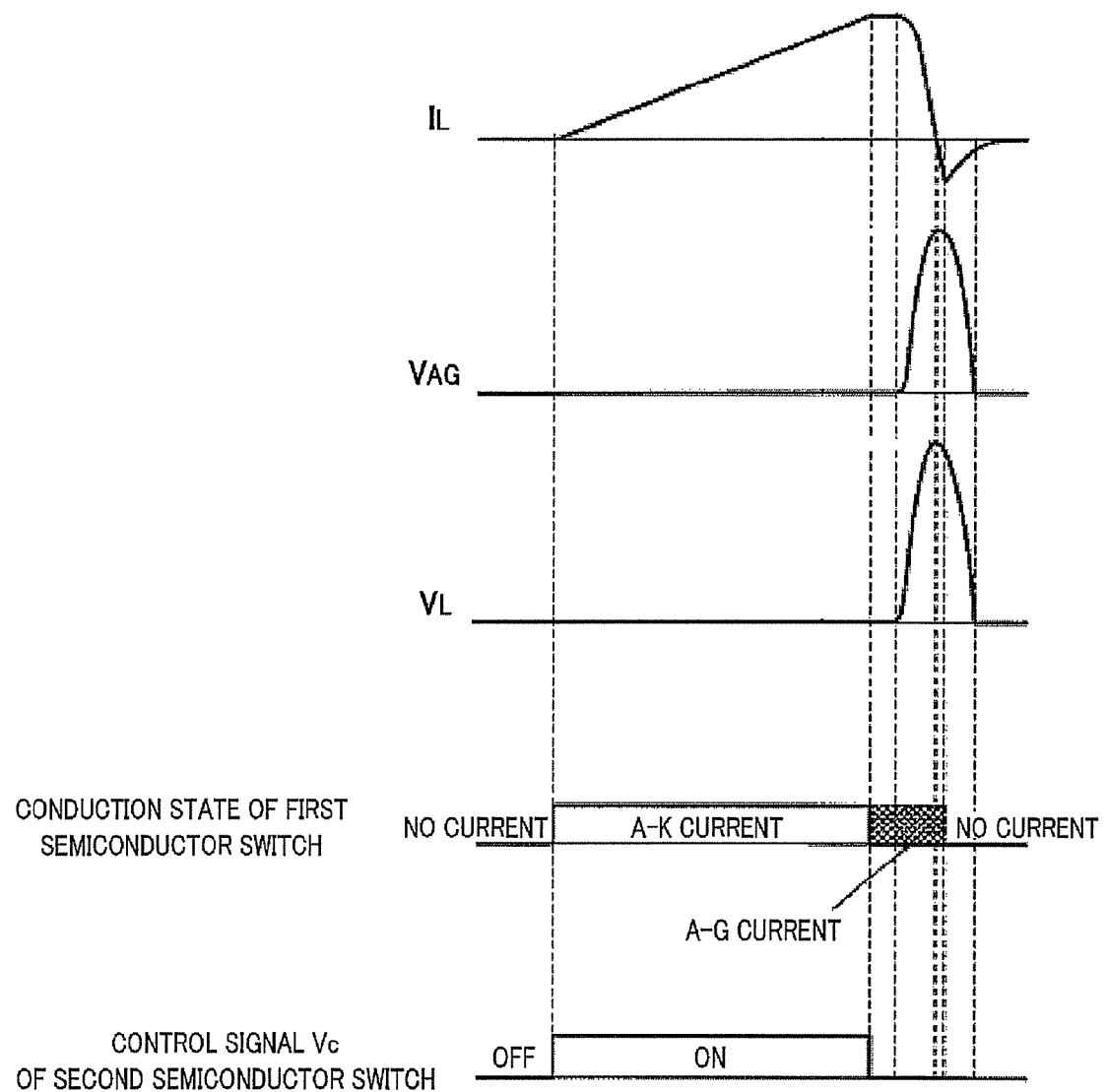
FIG. 2 shows an operation waveform of current and voltage of each part.

A pulse voltage generation mechanism in the primary winding circuit 44 of the amorphous carbon film forming apparatus 10 will be described. When the gate driving circuit 40 supplies a control signal Vc between the gate and source of the power MOSFET 38, the power MOSFET 38 is turned on from an off state. At this point, the first semiconductor switch 32 is turned on by a field effect caused by applying a positive voltage between the gate terminal 32G and cathode terminal 32K thereof due to a significantly large impedance provided in opposite polarity by the diode 42. As a result, a current flows between the anode terminal 32A and the cathode terminal 32K (A-K current). When the first semiconductor switch 32 and the second semiconductor switch 34 are connected to allow current flow, a voltage, which is substantially the same as a voltage E of the DC power supply 24, is applied to the inductor 30, so that a desired amount of energy is stored. After the desired amount of energy is obtained, the gate driving circuit 40 stops supplying the control signal Vc to turn off the power MOSFET 38. At this time, a pulse voltage is generated at the inductor 30. Specifically, when the second semiconductor switch 34 is turned off, the current IL of the inductor 30 is commutated to the path from the anode terminal 32A of the first semiconductor switch 32 to the gate terminal 32G of the first semiconductor switch 32 to the anode of the diode 42 to the cathode of the diode 42, whereby a current flows between the anode terminal 32A and the gate terminal 32G (A-G current). A current due to the energy stored in the inductor 30 keeps flowing from the anode terminal 32A to the gate terminal 32G and the first semiconductor switch 32 shifts to an off state. Consequently, the voltage VAG between the anode and gate of the first semiconductor switch 32 and a voltage VL between the terminals of the inductor 30 sharply increase. When the current IL becomes nil, the voltages VAG and VL reach their peak. After that, when the first semiconductor switch 32 is turned off, the voltages VAG and VL sharply decrease. This is shown in FIG. 2. In FIG. 2, the current IL is a current that flows through the inductor 30, the voltage VAG is a voltage between the anode and gate of the first semiconductor switch 32, and the voltage VL is a voltage between the terminals of the inductor 30. A positive voltage and a negative voltage can be switched by changing the wiring. The detailed mechanism of a pulse voltage is described in, for example, Japanese Patent No. 3811681.

A process for forming the amorphous carbon film on the substrate 12 using the amorphous carbon film forming apparatus 10 will be described hereinafter. Helium gas is used as a carrier gas. The substrate 12 is placed on the supporting electrode 14. Air is evacuated from the air outlet 20a using the vacuum pump (not shown) such that the pressure in the chamber 20 is reduced to 0.01 atm or less. Helium gas and hydrogen gas are then injected to the chamber 20 from the mixed-gas injection orifice 16a such that the pressure in the chamber 20 reaches 0.2 atm. Subsequently, a DC pulse voltage is applied between the supporting electrode 14 and the counter electrode 16. This means that a DC pulse voltage is generated in the coil element 48 of the secondary winding circuit 50 through the primary winding circuit 44 of the DC pulse generator 22. The generated pulse voltage is applied between the supporting electrode 14 and the counter electrode 16 and plasma is generated therebetween. As a result, the surface of the substrate 12 is etched with the plasma. After that, the hydrogen gas is changed to a tetramethylsilane gas, and the tetramethylsilane gas and the helium gas are injected to the chamber 20 from the mixed-gas injection orifice 16a such that the pressure in the chamber 20 reaches 0.2 atm in the same manner as described above, to form an amorphous silicon carbide film that is an intermediate layer. The intermediate layer is formed so that the amorphous carbon film to be formed does not easily peel off from the substrate 12.

A mixed gas of the carrier gas and acetylene gas whose percentage (hereinafter referred to as an acetylene gas ratio) relative to the carrier gas is 0.05% by volume or more and 10% by volume or less is injected to the chamber 20 from the mixed-gas injection orifice 16a such that the pressure in the chamber 20 reaches a desired pressure specified in the range of 10 Torr or more and smaller than or equal to atmospheric pressure. A DC pulse voltage is then applied between the supporting electrode 14 and the counter electrode 16 such that a positive DC pulse voltage having a pulse width of 0.1 μsec or more and 5.0 μsec or less is applied to the counter electrode 16. As a result, plasma is generated between the supporting electrode 14 and the counter electrode 16 to form the amorphous carbon film on the substrate 12. At this point, the gas injected from the mixed-gas injection orifice 16a flows toward the air outlet 20a disposed on the lower portion of the chamber 20 and is discharged from the air outlet 20a.

In the method for forming the amorphous carbon film using the amorphous carbon film forming apparatus 10 according to the embodiment described above, acetylene gas is used as a gas that forms the amorphous carbon film such that the hardness of the film is prevented from being increased. Thus, an amorphous carbon film with a relatively low hardness can be formed at a pressure of more than 10 Torr and smaller than or equal to atmospheric pressure. Specifically, an amorphous carbon film with a hardness of 0.5 GPa or more and 8 GPa or less can be formed. Furthermore, since the DC pulse generator 22 is used, a DC pulse voltage that sharply rises can be applied to the counter electrode 16.

Obviously, the present invention is not limited to the embodiment described above and various modifications can be made within the technical scope of the present invention.

For example, the DC pulse generator 22 applies a positive DC pulse voltage to the counter substrate 16 in the embodiment described above, but may apply a negative DC pulse voltage to the counter substrate 16.

Helium gas is used as a carrier gas in the embodiment described above, but argon gas, nitrogen gas, oxygen gas, hydrogen gas, carbon dioxide gas, or the like may be used instead of the helium gas.

EXAMPLES

Example 1

Air was evacuated from the air outlet 20a such that the pressure in the chamber 20 was reduced to 0.01 atm or less while the substrate 12 made of SUS440C having a diameter of 30 mm and a thickness of 5 mm was placed on the supporting electrode 14. At this time, the substrate 12 and the supporting electrode 14 had an electrical connection. A DC pulse voltage having a peak pulse voltage of 1.8 kV and a pulse half width of 0.8 μsec was applied between the supporting electrode 14 and the counter electrode 16. Helium gas and hydrogen gas were then injected to the chamber 20 from the mixed-gas injection orifice 16a for two minutes such that the pressure in the chamber 20 reached 0.2 atm. Subsequently, a DC pulse voltage having a peak pulse voltage of 2.0 kV and a pulse half width of 0.5 μsec was applied between the supporting electrode 14 and the counter electrode 16. Helium gas and a tetramethylsilane gas instead of the hydrogen gas were then injected to the chamber 20 for one minute. The pulse half width means a time interval at half the height of the peak pulse voltage.

In the state where the pressure in the chamber 20 was 0.2 atm, a DC pulse voltage having a peak pulse voltage of 1.4 kV and a pulse width of 0.8 μsec was applied between the supporting electrode 14 and the counter electrode 16, and acetylene gas with a flow rate of 1 cc/min and helium gas with a flow rate of 2.0 L/min were injected for two minutes. The acetylene gas ratio was 0.05% by volume. Consequently, an amorphous carbon film was formed on the substrate 12. The temperature of the supporting electrode 14 was set to 200° C.

It was confirmed that the obtained amorphous carbon film was a good amorphous carbon film, by conducting a spectroscopic analysis on the obtained amorphous carbon film using a Raman spectrometer (NRS-1000 available from JASCO Corporation). The hardness of the obtained amorphous carbon film was also measured using a mechanical property evaluation apparatus for thin films (Nano Indenter XP available from MTS Systems Corporation). The hardness was 0.5 GPa. Table 1 shows film-forming conditions and the results related to the film formation of Example 1.

TABLE 1

| | Comparative Example 1 | Comparative Example 2 | Comparative Example 3 | Example 1 | Example 2 | Example 3 | Example 4 | Example 5 | Example 6 | Comparative Example 4 | Comparative Example 5 |
|---|---|---|---|---|---|---|---|---|---|---|---|
| Acetylene gas (cc/min) | — | — | — | 1 | 1.6 | 2 | 20 | 50 | 200 | 220 | 250 |
| Methane gas (cc/min) | 50 | 100 | 200 | — | — | — | — | — | — | — | — |
| Acetylene gas ratio (% by volume) | — | — | — | 0.05 | 0.08 | 0.1 | 1.0 | 2.5 | 10.0 | 11.0 | 12.5 |
| Methane gas ratio (% by volume) | 2.5 | 5.0 | 10.0 | — | — | — | — | — | — | — | — |
| Helium gas (L/min) | 2.0 | 2.0 | 2.0 | 2.0 | 2.0 | 2.0 | 2.0 | 2.0 | 2.0 | 2.0 | 2.0 |
| Peak pulse voltage (kV) | 1.5 | 1.4 | 1.2 | 1.4 | 1.38 | 1.35 | 1.33 | 1.3 | 1.2 | 1.1 | 1.0 |
| Pulse width (μsec) | 1.0 | 1.2 | 1.4 | 0.8 | 0.9 | 1.0 | 1.1 | 1.2 | 1.3 | 1.35 | 1.5 |
| Film formation | OK | OK | OK | OK | OK | OK | OK | OK | OK | Partial discharge | Arc discharge |
| Hardness (GPa) | 18 | 22 | 25 | 0.5 | 1.0 | 2.0 | 3.5 | 6.0 | 8.0 | 10.0 | — |
| Film forming rate (μm/min) | 0.4 | 0.5 | 0.7 | 0.02 | 0.1 | 0.3 | 1.5 | 3.0 | 4.0 | 4.5 | — |

Comparative Examples 1 to 3

In Comparative Examples 1 to 3, formation of amorphous carbon films was attempted by generating plasma in accordance with the procedure of Example 1 described above under the conditions shown in Table 1 using methane gas instead of acetylene gas. A DC pulse voltage having a peak pulse voltage of 1.5 kV to 1.2 kV and a pulse width of 1.0 μsec to 1.4 μsec was applied. The results are shown in Table 1. As evident from Table 1, carbon films with a hardness of 18 GPa to 25 GPa, which exceeded 10 GPa, were formed. In Table 1, the methane gas ratio means the percentage of methane gas relative to helium gas that is a carrier gas.

Examples 2 to 6 and Comparative Examples 4 and 5

In Examples 2 to 6 and Comparative Examples 4 and 5, formation of amorphous carbon films was attempted in accordance with the procedure of Example 1 described above under the conditions shown in Table 1 with an acetylene gas ratio of 0.08% by volume to 12.5% by volume. A DC pulse voltage having a peak pulse voltage of 1.38 kV to 1.0 kV and a pulse width of 0.9 μsec to 1.5 μsec was applied. The results are shown in Table 1. In Examples 1 to 6, amorphous carbon films with a hardness of 0.5 GPa to 8.0 GPa were formed. Note that the hardness of an amorphous carbon film that is applicable to a coating used for sliding metal parts is preferably 1 GPa or more and less than 8 GPa, more preferably 2 GPa or more and less than 8 GPa. In Comparative Example 4, discharge occurred partly and a uniform film was not formed, which provided a film with a hardness of 10 GPa. In Comparative Example 5, arc discharge occurred and formation of a carbon film was unstable. As evident from Table 1, the film forming rate tends to become high and the hardness of the formed amorphous carbon film tends to increase in proportion to the acetylene gas ratio in Examples 1 to 6 and Comparative Example 4.

Comparative Example 6, Examples 7 to 10, and Comparative Example 7

In Comparative Example 6, Examples 7 to 10, and Comparative Example 7, formation of amorphous carbon films was attempted in accordance with the procedure of Example 5 except for the conditions of a DC pulse voltage having a pulse width of 0.05 μsec to 7.5 μsec. The peak pulse voltage of the DC pulse voltage was 2.5 kV to 1.0 kV. The results are shown in Table. 2. In Comparative Example 6, discharge did not occur. In Examples 7 to 10, glow discharge was observed. In Comparative Example 7, arc discharge occurred. When the pulse width is in the range shown in Examples 7 to 10, the film forming rate was 0.7 to 5.7 μm/min, which was higher than the general film forming rate under vacuum (0.01 μm/min). It was also found that the film forming rate tends to become high in proportion to the pulse width in Examples 5 and 7 to 10.

| | Comparative Example 6 | Example 7 | Example 8 | Example 5 | Example 9 | Example 10 | Comparative Example 7 |
|---|---|---|---|---|---|---|---|
| Pulse width (μsec) | 0.05 | 0.1 | 0.5 | 1.2 | 2.5 | 5.0 | 7.5 |
| Discharge stability | Discharge not occurring | Glow discharge | Glow discharge | Glow discharge | Glow discharge | Glow discharge | Glow discharge |
| Peak pulse voltage (kV) | 2.5 | 2.2 | 1.6 | 1.3 | 1.15 | 1.05 | 1.0 |
| Film forming rate (μm/min) | — | 0.7 | 2.2 | 3.0 | 4.5 | 5.7 | — |

Figure 3:
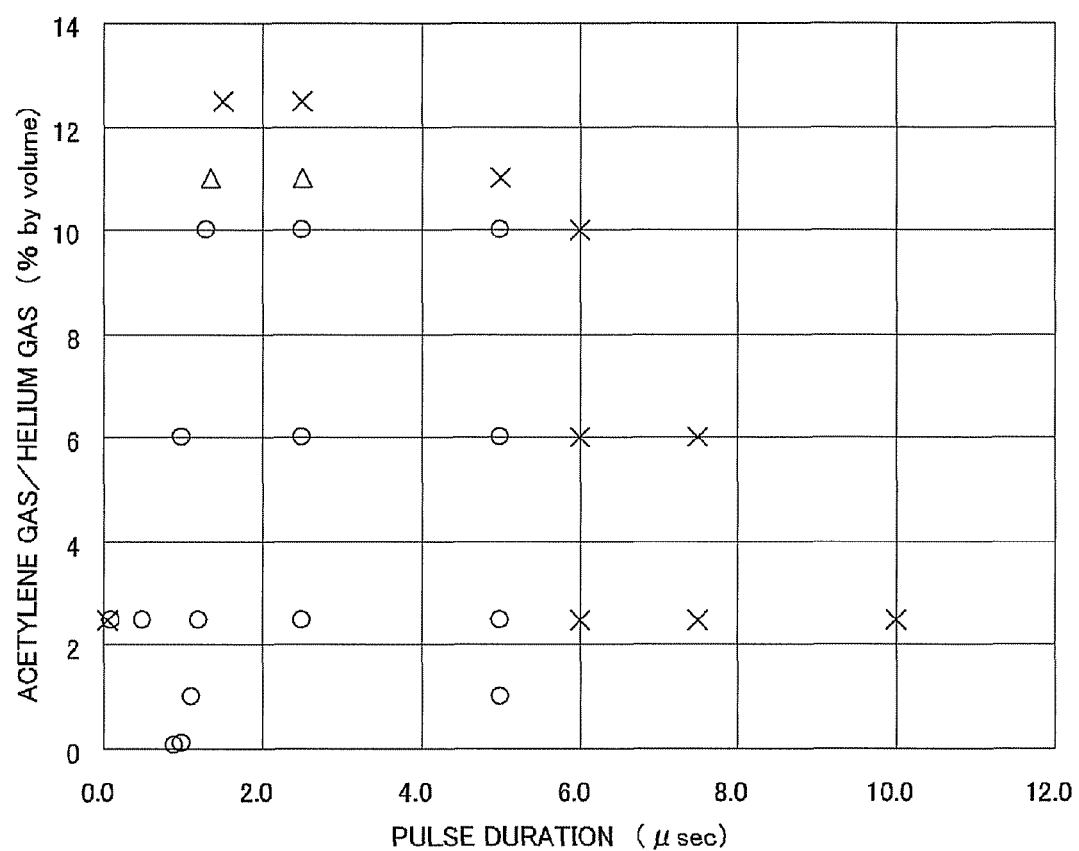
FIG. 3 is a graph showing results obtained after formation of amorphous carbon films is attempted.

FIG. 3 is a graph in which these results and other results (not shown) are summarized. In FIG. 3, pulse widths are plotted on the abscissa and the acetylene gas ratios are plotted on the ordinate. In the graph, circles represent the conditions under which an amorphous carbon film is successfully formed, triangles represent the conditions under which such a film is partly formed or the hardness of the film is less than 0.5 GPa or more than 10 GPa, and crosses represent the conditions under which formation of such a carbon film is unstable.

The present application claims priority to Japanese Patent Application No. 2008-083520 filed on Mar. 27, 2008, the entire contents of which are incorporated herein by reference.

What is claimed is:
1. A method for forming an amorphous carbon film on a base material using an amorphous carbon film forming appa- ratus that includes a supporting electrode connected to ground and a counter electrode disposed so as to oppose the supporting electrode, comprising the steps of:
- (a) placing the base material on the supporting electrode, the base material being placed apart from the counter electrode;
- (b) establishing a pressure within the apparatus of 10 Torr or more and smaller than or equal to atmospheric pressure; and
- (c) forming an amorphous carbon film having a hardness of 2 GPa or more and 8 GPa or less by supplying a mixed gas of acetylene gas and a carrier gas carrying the acetylene gas between the supporting electrode and the counter electrode such that the percentage of the acetylene gas relative to the carrier gas is 0.05% by volume or more and 10% by volume or less, and by generating plasma while a DC pulse voltage having a pulse width of 0.1 μsec or more and 5.0 μsec or less is applied to the counter electrode.

2. The method for forming an amorphous carbon film according to claim 1, wherein the DC pulse voltage is a positive voltage.

3. The method for forming an amorphous carbon film according to claim 1, wherein the base material is made of an SUS material, an SKD material, an SKH material, an SS material, aluminum, or an aluminum alloy.

4. The method for forming an amorphous carbon film according to claim 1, wherein, in the step (c), a device having an inductor, a first semiconductor switch, and a second semiconductor switch that are connected in series between both terminals of a DC power supply unit is used as a generator of the DC pulse voltage, the inductor having a terminal connected to an anode terminal of the first semiconductor switch and another terminal connected to a gate terminal of the first semiconductor switch through a diode, the diode having an anode terminal connected to the gate terminal of the first semiconductor switch; inductive energy is stored in the inductor with an electrical connection of the first semiconductor switch that occurs when the second semiconductor switch is turned on; and a pulse voltage is generated in the inductor with a turn-off of the first semiconductor switch that occurs when the second semiconductor switch is turned off, and the pulse voltage is raised and supplied to a coil element magnetically connected to the inductor.

\* \* \* \* \*